United States Patent
Wright et al.

(10) Patent No.: US 6,366,523 B1
(45) Date of Patent: Apr. 2, 2002

(54) METHOD AND APPARATUS FOR ANTICIPATORY SELECTION OF EXTERNAL OR INTERNAL ADDRESSES IN A SYNCHRONOUS MEMORY DEVICE

(75) Inventors: Jeffrey P. Wright; Steven F. Schicht, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/655,167

(22) Filed: Sep. 5, 2000

Related U.S. Application Data (60) Continuation of application No. 09/333,814, filed on Jun. 15, 1999, now Pat. No. 6,115,314, which is a division of application No. 08/997,498, filed on Dec. 23, 1997, now Pat. No. 5,923,604.

(51) Int. Cl.$^7$ .................................................. G11C 8/00
(52) U.S. Cl. ............. 365/230.02; 365/233; 365/230.08
(58) Field of Search .......................... 365/230.02, 233, 365/230.06, 230.08, 193

(56) References Cited

U.S. PATENT DOCUMENTS

| | | | |
|---|---|---|---|
| 4,564,926 A | * | 1/1986 | Nikaido et al. ............. 365/230 |
| 4,802,135 A | | 1/1989 | Shinoda et al. ............. 365/233 |
| 5,394,373 A | * | 2/1995 | Kawamoto ............. 365/230.06 |
| 5,598,376 A | | 1/1997 | Merritt et al. ........ 365/230.06 |
| 5,668,773 A | | 9/1997 | Zagar et al. ................. 365/233 |
| 5,854,769 A | * | 12/1998 | Lee ........................ 365/230.02 |
| 5,923,604 A | | 7/1999 | Wright et al. .......... 365/230.03 |
| 5,991,226 A | * | 11/1999 | Bhullar ................... 365/230.08 |

* cited by examiner

*Primary Examiner*—Richard Elms
*Assistant Examiner*—Van Thu Nguyen
(74) *Attorney, Agent, or Firm*—Dorsey & Whitney LLP (57) ABSTRACT

A method and apparatus are disclosed for selecting either an external column address or an internal column address in a synchronous memory device. The external or internal address is selected by decoding command signals applied to the memory device. If the command signals correspond to a read or a write memory access, an external column address is selected. If the command signals correspond to a burst read or write memory access, an internal column address is selected. Significantly, the command signals are decoded prior to the transition of a clock signal that initiates a memory access so that a column address decoder is already connected to the proper column address source prior to the start of a memory access.

18 Claims, 8 Drawing Sheets

Fig. 9

METHOD AND APPARATUS FOR ANTICIPATORY SELECTION OF EXTERNAL OR INTERNAL ADDRESSES IN A SYNCHRONOUS MEMORY DEVICE

CROSS-REFERENCE TO RELATED APPLICATIONS

This application is a continuation of U.S. patent application Ser. No. 09/333,814, filed Jun. 15, 1999 now U.S. Pat. No. 6,115,314 which is a divisional of U.S. application Ser. No. 08/997,498 filed Dec. 23, 1997, and issued as U.S. Pat. No. 5,923,604.

TECHNICAL FIELD

This invention relates to synchronous memory devices, and more particularly, to a method and apparatus for more quickly processing addresses applied to synchronous memory devices.

BACKGROUND OF THE INVENTION

Memory devices are in widespread use in computers, particularly personal computers. The system memory of such computers is generally provided by dynamic random access memories ("DRAMs"). DRAMs were initially asynchronous in which commands and addresses were received and processed by DRAMs at a rate that was not determined by a periodic signal. However, in an attempt to reduce memory access times and facilitate pipelining of memory accesses. synchronous DRAMs ("SDRAMs") were developed.

Figure 1:
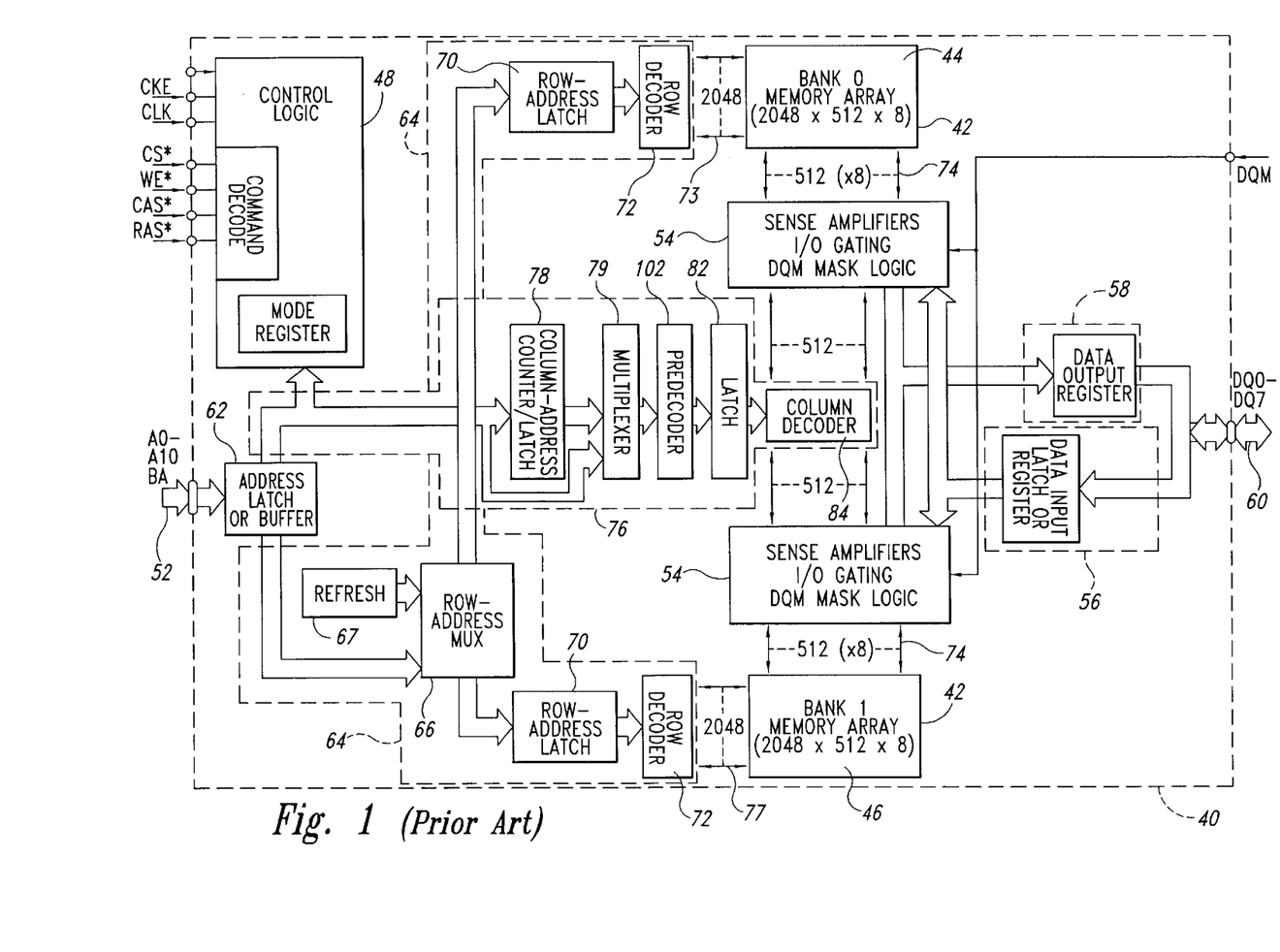
FIG. 1 is a block diagram of a prior art synchronous dynamic random access memory ("SDRAM") that can advantageously use one embodiment of an address selection circuit in accordance with the invention.

In a SDRAM, memory accesses are synchronized to an external clock that is applied to the DRAM so that one memory access, i.e., a read or write, occurs each period of the clock. An example of a conventional SDRAM 40 is shown in FIG. 1. The SDRAM 40 has as its central memory element a memory array 42 that is segmented into two banks 44, 46. The SDRAM 40 operates under control of a control logic 48 that receives a system clock signal CLK, a clock-enable signal CKE, and several command signals that control reading from and writing to the SDRAM 40. Among the command signals are a chip-select signal CS*, a write-enable signal WE*, a column address strobe signal CAS*, and a row address strobe signal RAS*. (The asterisk next to the command signals CS, WE, CAS, and RAS indicate that these signals are active low signals, i.e., the command signals CS*, WE*, CAS*, and RAS* go to a low logic level when active).

In addition to the command signals, the SDRAM 40 also receives addresses from an address bus 52, and receives or outputs data on a data bus 60. The received addresses are either bank/row addresses or column addresses. An address on the address bus 52 is designated as a row addresses by a row address strobe RAS* signal transitioning active low when the address is present on the address bus. An address on the address bus 52 is designated as a column addresses by a column address strobe CAS* signal transitioning active low when the address is present on the address bus. As explained below, column addresses can also be generated internally. In any case, addresses from the address bus 52 are clocked into the SDRAM 40 through an address register or address latch 62. If an address is a row address, the address is coupled to the array 42 through a row address path 64. The row address path 64 includes a row address multiplexer 66 that receives the external row address from the address latch 62 and receives an internal row address from a refresh circuit 67. The row address multiplexer 66 provides the row addresses to either of two row address latches 70 depending upon the logic state of the bank address BA. The row address latches 70 latch the row addresses and provide the row addresses to respective row decoders 72. The row decoders 72 take the 11-bit address from the row address latch 70 and activate a selected one of 2,048 row address lines 73. The row address lines 73 are conventional lines for selecting row addresses of locations in the memory array 42. As noted above, the following discussion assumes that the row address has been selected and that the selected row is activated.

After a row address has been received and latched by RAS* going low, a column address may be latched responsive to a column address strobe signal CAS* going active low. If the address received at the address latch 62 is a column address, it is transmitted to the I/O interface 54 and the memory array 42 through a column address path 76. The column address path includes a column address counter/latch 78 that receives an initial column address from the address latch or buffer 62 and thereafter increments the address once each cycle of the CLK signal. The column address from the column address counter/latch 78 is thus an internally generated column address, as mentioned above.

The internal column address from the column address counter/latch 78 and an external column address from the address latch or buffer 62 are each applied to a multiplexer 79. The multiplexer 79 selects one of these column addresses based on the nature of the current memory access. If the current memory access is one of several identical memory accesses (i.e., a READ or a WRITE) to successive columns of a row, known as a "burst" memory access, the multiplexer 79 selects the internal address from the column address counter/latch 78 unless a new command is received. If, during a burst memory access, e.g., a burst READ, a new command, e.g., a burst WRITE, is received, the multiplexer 79 selects an external column address from the address latch or buffer 62.

In operation, the SDRAM 40 assumes a number of states before and during a memory transfer. Initially, the SDRAM 40 is in an idle state prior to the start of a memory transfer. When data are to be read from or written to the memory device, a row address is applied to the address bus 52 and an active low RAS* signal is applied to the command decoder in the control logic 48. Thus, in the idle state, the only address used by the SDRAM 40 is an external row address. There is therefore never any need to use an internal address in the idle state. The transition of the RAS* signal to an active low state transitions the SDRAM 40 from the idle state to the row active state.

During the row active state, the memory cells in a selected row of the array 42 that corresponds to the row address are coupled to respective digit lines. As is well understood in the art, there are a set of complementary digit lines for each column of the memory arrays 42. Once the SDRAM 40 has transitioned to the row active state, the SDRAM 40 can transition to the column command state responsive to the RAS* signal transitioning high and the CAS* signal transitioning active low. In the column command state, the SDRAM 40 can receive and process a column address and a column command, such as a READ or a WRITE command. Thus, once the SDRAM 40 transitions from the row active state to the column command state, the SDRAM 40 can process a column address that, as explained above, can be either an external column address applied to the address bus 52 or an internal column address generated by the column address counter latch. When a memory command is received that is not for a burst memory access, the multiplexer 79 selects an external column address from the address latch or buffer 62. In a burst memory transfer, the column address counter/latch 78 increments the initial column address once each cycle of the CLK signal to generate a number of sequential column addresses corresponding to the length of the burst.

After data are read from or written to the SDRAM 40, the RAS* signal transitions inactive high to transition the SDRAM 40 back to the idle state during which precharging of the array 42 occurs before the start of another memory access.

As explained further below, the time required to determine whether an internal column address or an external column address should be selected by the multiplexer 79 can significantly slow the rate at which memory accesses can occur. The inventive method and apparatus is adapted to allow this determination to be made at an earlier time so that memory accesses can occur at a faster rate.

After the multiplexer has selected either an internal address or an external address, the multiplexer 79 couples the selected column address to a pre-decoder 102 and a latch 82. The pre-decoder 102 partially decodes the column address and passes it to a column decoder 84 to complete the decoding. The decoder 84 then selects the column to which data are to be read from or written to.

The input data path 56 transmits data from the data bus 60 to the I/O interface 54. The output data path 58 transmits data from the I/O interface 54 to the data bus 60.

Figure 2:
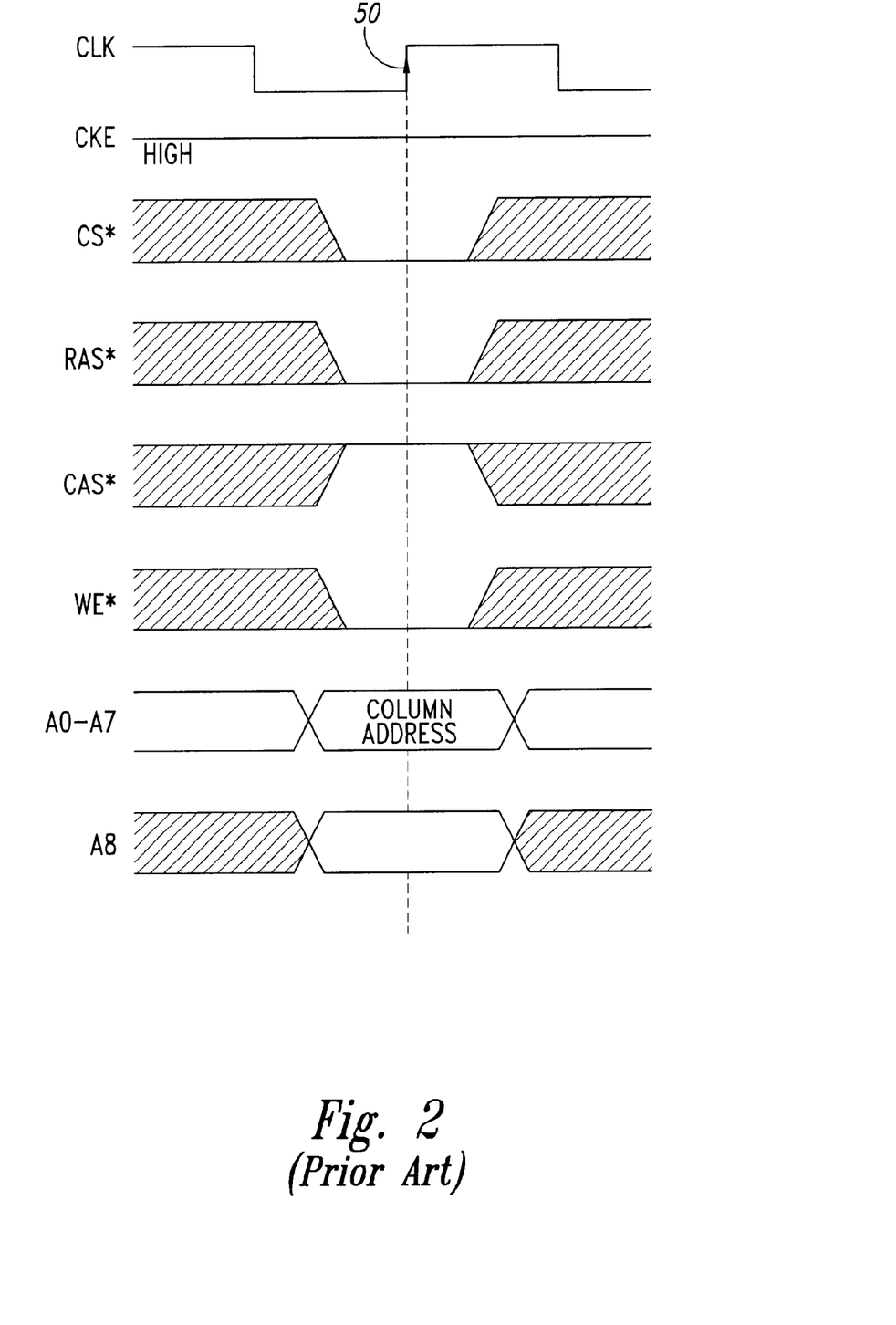
FIG. 2 is a timing diagram showing the combination of command signals that correspond to a ROW ACTIVATE command in the SDRAM of FIG. 1.

During a memory access, the control logic 48 decodes the command signals according to a predetermined protocol to identify the row active state and the column command state for execution by the SDRAM 40. The row active command then transitions the SDRAM 40 to the row active state as shown in FIG. 2. Note that the RAS* signal is active low and the CAS* signal is inactive high in the row active state. As mentioned above, in the row active state, the only address that can be processed by the SDRAM 40 is a row address received on the address bus 52. Thus, in the row active state, there is never a need to process an external column address.

Figure 3:
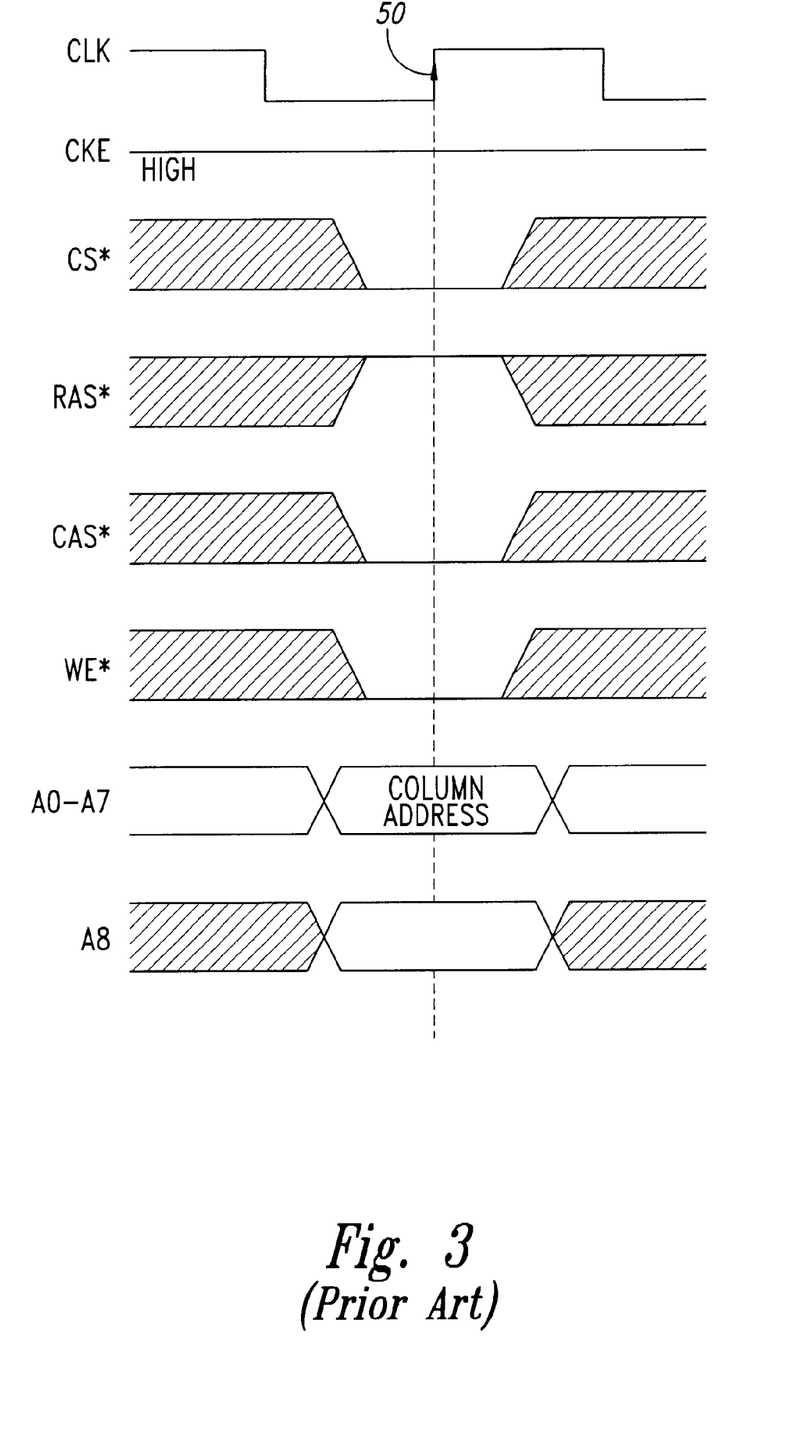
FIG. 3 is a timing diagram showing the combination of command signals that correspond to a WRITE command in the SDRAM of FIG. 1.
Figure 4:
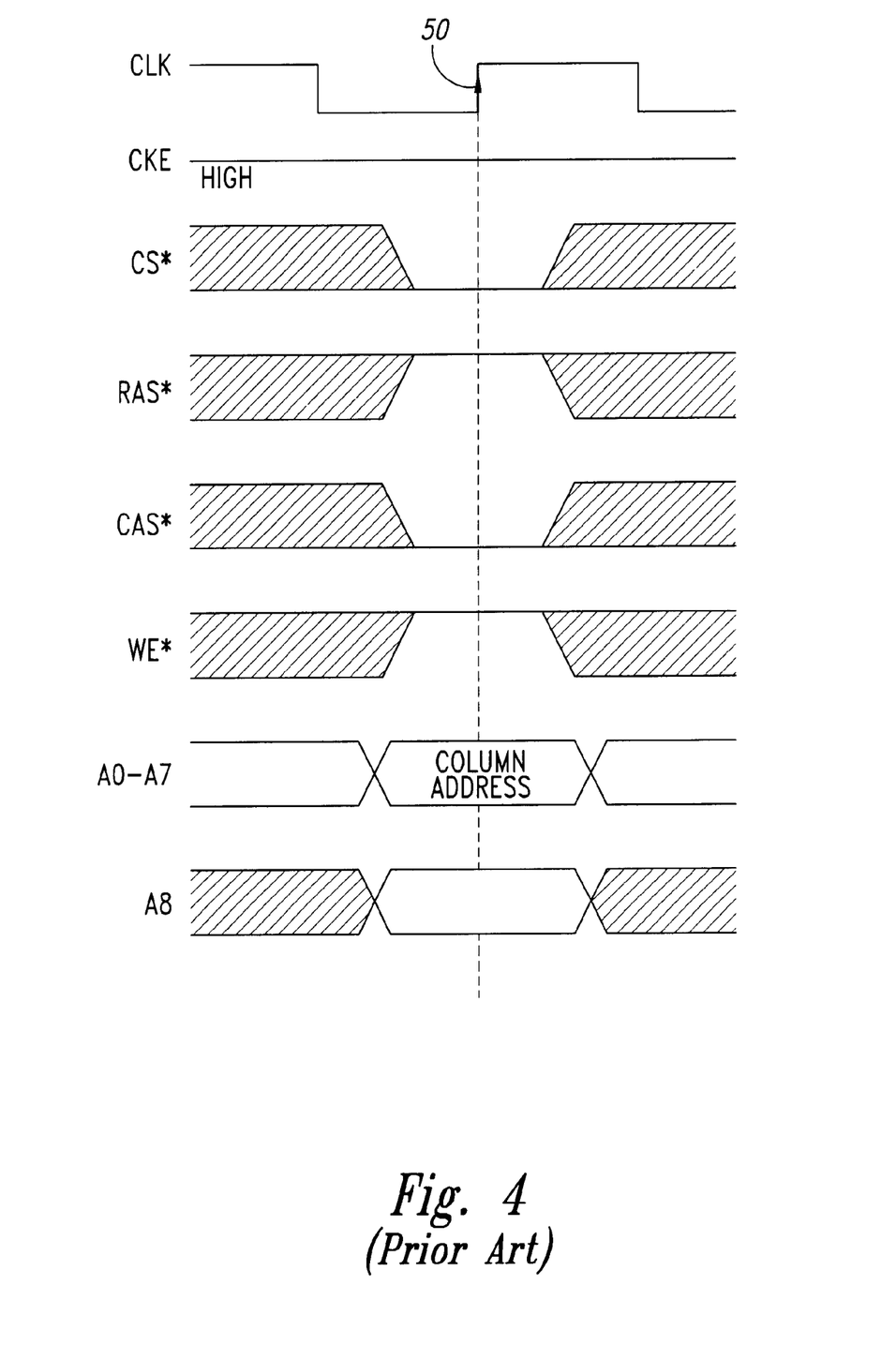
FIG. 4 is a timing diagram showing the combination of command signals that correspond to a READ command in the SDRAM of FIG. 1.

FIGS. 3 and 4 show clock and command signals and their states for write commands and read commands, respectively. Note that, in these commands, the RAS* signal is inactive high and the CAS* signal is active low. The read and write commands differ only in the state of the write-enable signal WE*. The write-enable signal WE* is an active low signal such that, if the write-enable signal WE* is low, the data transfer operation will be a write, as shown in FIG. 3. If the write-enable signal WE* is high, the data transfer operation will be a read, as shown in FIG. 4. In the remaining figures, these combination of command signals corresponding to the read and write commands will be shown as simply a "read" command or a "write" command in the interests of brevity and clarity.

Figure 5:
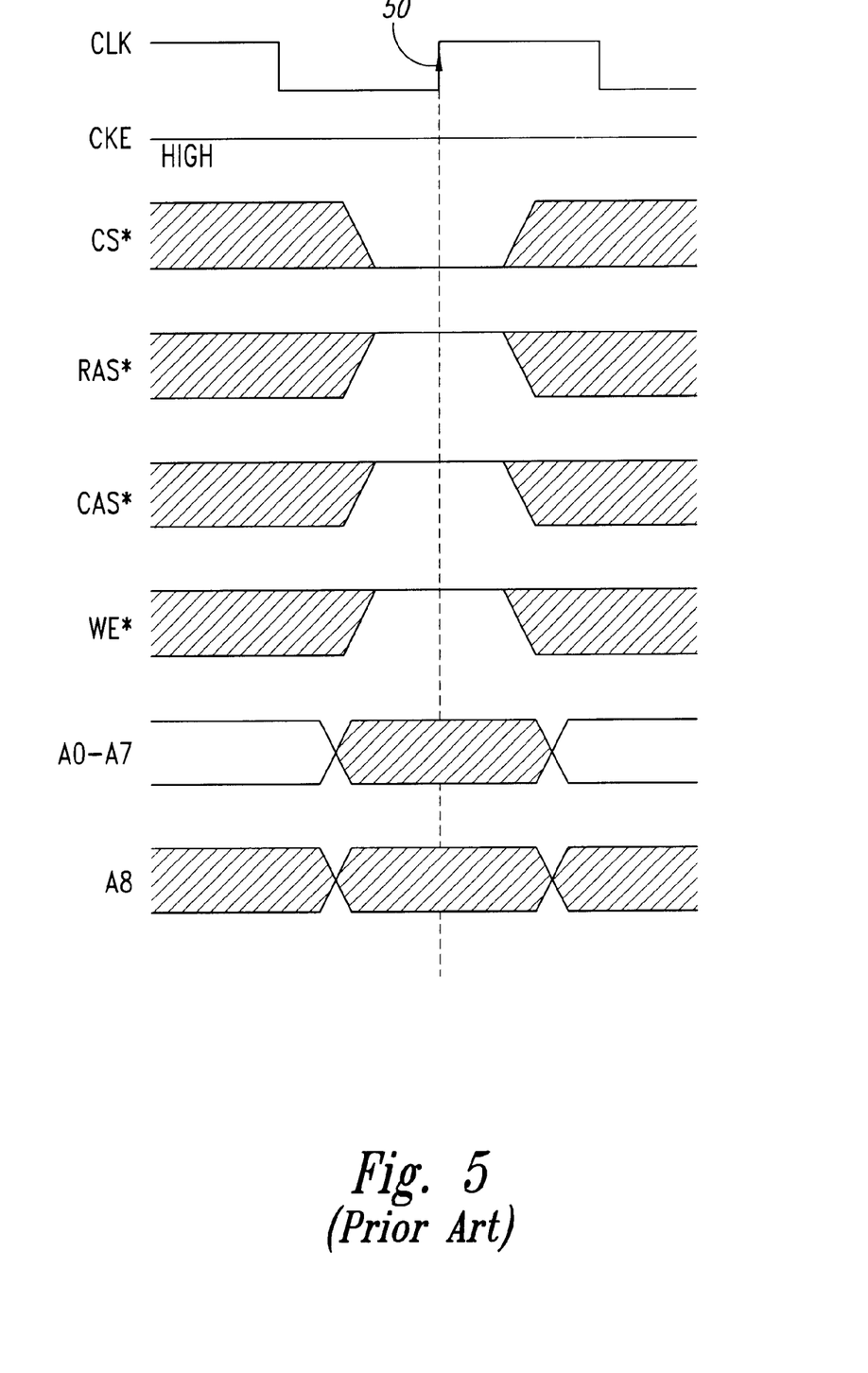
FIG. 5 is a timing diagram showing the combination of command signals that correspond to a no operation ("NOP") command in the SDRAM of FIG. 1.

With reference to FIG. 5, a no operation ("NOP") command is the same as the read command shown in FIG. 4 except that CAS* is inactive high rather than active low. The NOP command is used during a burst memory transfer, as explained below. As also mentioned above, an internal address is used for a burst memory transfer while an external column address is used in other memory transfers.

As is conventional to SDRAM operation, the row address is received and stored, and the selected row is activated prior, prior to either a column command or the column address being applied to the address bus 52 (FIG. 1) and the column address strobe signal CAS* going low.

As indicated by the arrow 50 in FIGS. 2–5, the leading edge of each pulse of the clock signal CLK establishes the time at which the states of the signals are determined. The clocking of the control logic 48 by the clock signal CLK is enabled by the clock-enable signal CKE, which is high for reading and writing. Also, reading and writing from the SDRAM 40 is enabled only when the SDRAM 40 is selected, as indicated by the chip-select signal CS*.

The control logic 48 decodes the above-described command signals CKE, CLK, CS*, WE*, CAS*, and RAS* to determine whether the SDRAM 40 is to be placed in either the idle, row active, or column command states. The control logic 48 then controls reading from or writing to the memory array 42 by controlling an I/O interface 54 and input and output data paths 56, 58. The I/O interface 54 is any conventional I/O interface known in the art, and includes typical I/O interface elements, such as sense amplifiers, mask logic, precharge and equilibration circuitry, and input and output gating.

The control logic 48 causes the multiplexer 79 (FIG. 1) to couple either an external column address from the address latch or buffer 62 or an internal column address from the column address counter/latch 78 based on the nature of the command signals applied to the control logic 48. As explained above, if the row address strobe signal RAS* is inactive high, the SDRAM 40 is in the idle state in which none of the rows of the memory array 40 is yet active. Under these circumstances, the SDRAM 40 cannot be in a burst transfer mode in which the column address counter/latch 78 generates an internal counter address. Thus, the control logic 48 prevents the multiplexer 79 from coupling an internal column address from the column address counter/latch 78 to the pre-decoder 102 before a row has been activated, and the row address strobe signal RAS* transitions low. However, when the row address strobe signal RAS* has transitioned active low and a row has been activated, then a memory access can either be an access to a column corresponding to a column address or a burst memory access. In the case of a memory access to a column corresponding to a column address, the multiplexer 79 must couple the external address from the address latch or bar for 62 to the pre-decoder 102. In the case of a burst memory access, the multiplexer 79 must couple an internal column address from the column address counter/latch 78 to the pre-decoder 102. In the event the row address strobe signal RAS* is high, the control logic 48 generates an appropriate signal for controlling the multiplexer 79 based on the nature of some of the remaining commands that are applied to the control logic 48, as explained below.

Figure 6:
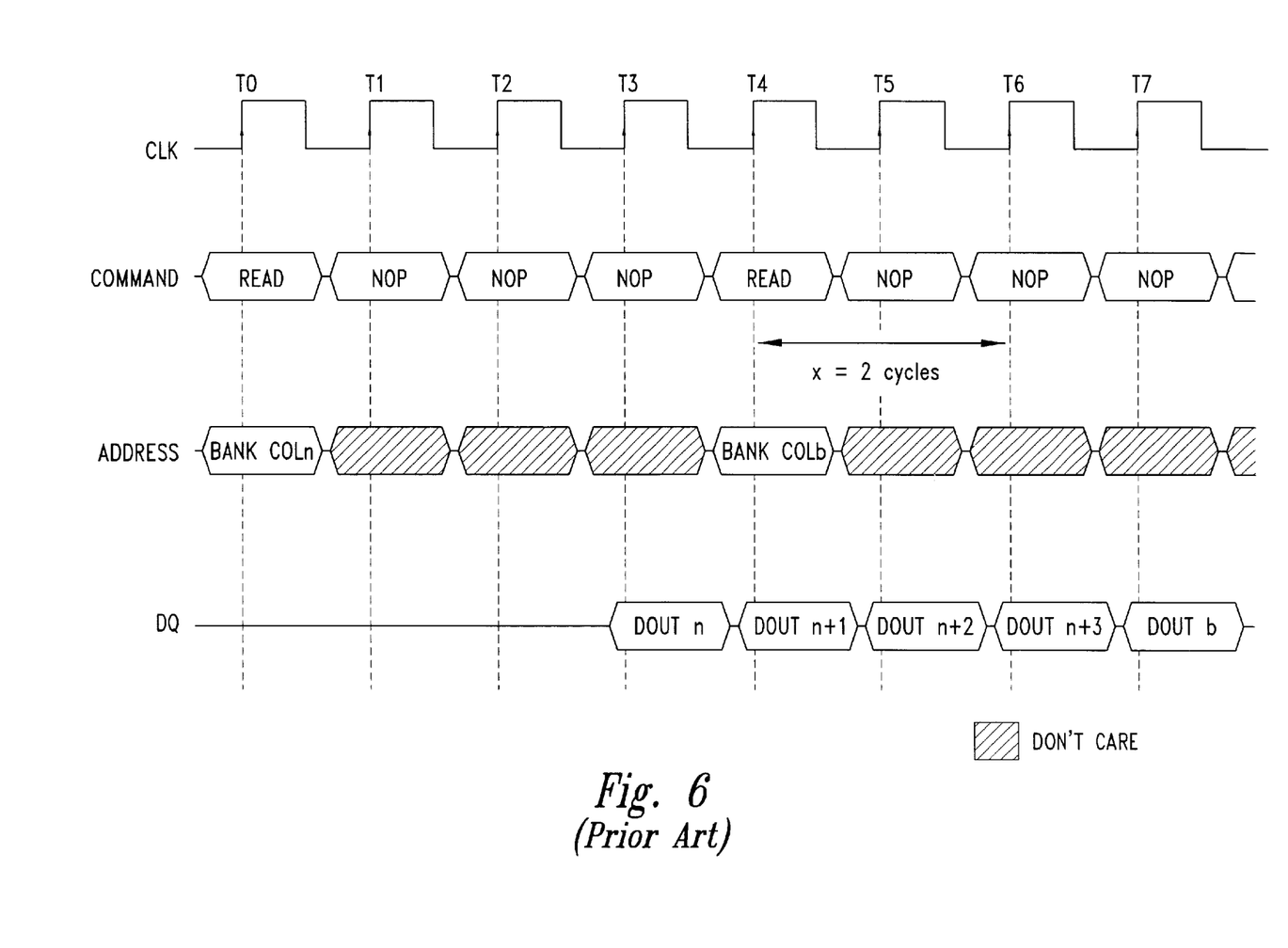
FIG. 6 is a timing diagram showing the combination of command signals that correspond to a pair of burst READ memory accesses in the SDRAM of FIG. 1.

The operation of the SDRAM 40 for a burst of four read starting at a first column address followed by a burst of four read starting at a second column address is illustrated FIG. 6. At time to the CLK signal goes high to clock a READ command into the control logic 48. At the same time, a column address is applied to the address bus 52 of the SDRAM 40. Although not shown in FIG. 6, the column address strobe signal CAS* goes low at to to clock the column address into the column address counter/latch 78 (FIG. 1). The control logic then decodes the READ command to determine that the multiplexer 79 should couple the external address from the address latch or buffer 62 to the pre decoder 102. The column decoder 84 then causes data to be read from the memory cell in the column corresponding to the column address that intersects the active row corresponding to the last row address.

On the leading-edge of the next clock cycle at $t_1$, a NOP command is clocked into to the SDRAM 40. The column address counter/latch 78 responds to the CLK signal by incrementing, thereby applying a column address to the multiplexer 79 that is one column greater than the previous column address. However, the control logic 48 has not yet determined whether the multiplexer 79 should respond to the internal column address from the column address counter/latch 78 or the external address from the address latch or buffer 62. Therefore, subsequent to $t_1$, the control logic 48 decodes the NOP command and, on that basis, determines that a burst memory access is in process and that the internal column address should be used. The multiplexer 79 then couples the internal column address to the pre-decoder 102.

In the same manner as described above, the column address counter/latch 78 generates incrementally increasing internal addresses at $t_2$ and $t_3$. In each case, the control logic 48 decodes the NOP command and causes the multiplexer 79 to couple the internal column address from the column address counter/latch 78 to the pre-decoder 102.

At the leading-edge of the CLK signal at $t_4$, a new column command, i.e., a READ from a memory cell at a different column address, is applied to the control logic 48. Shortly after $t_4$, the control logic 48 has decoded the READ command to determine that the multiplexer 79 should couple the external column address from the address latch or buffer 62 to the pre-decoder 102. Thereafter, the SDRAM 40 responds to the next three NOP commands as a burst of four READ command, as described above.

One problem with the operation of the SDRAM 40 illustrated in FIG. 6 is the time delay needed to determine whether the multiplexer 79 should couple an external column address from the address latch or buffer 62 to the pre-decoder 102 or an internal column address from the column address counter/latch 78 to the pre-decoder 102. As explained above, the control logic 48 does not begin to make this determination until the column command, i.e., a READ, WRITE, or a NOP command is clocked into the control logic 48 at the leading edge of the CLK signal. After the command has been decoded, the control logic 48 must apply a corresponding signal to the multiplexer 79, and the multiplexer 79 must then couple either the internal column address or the external column address to the pre-decoder 102. The amount time required to perform these functions can be considerable. If these functions are not performed quickly enough, the control logic 48 may not control the multiplexer 79 until after the falling edge of the CLK signal when an invalid column address may be present at the address bus 52 or invalid data may be present at the data bus 60, in the case of a write operation. In fact, the primary technique for preventing this problem from occurring is to limit the frequency of the CLK signal so that the multiplexer 79 can couple either the internal column address or the extra column address to the pre-decoder 102 prior to the trailing edge of the CLK signal. However, limiting the frequency of the CLK signal limits the speed at which data can be read from or written to the SDRAM 40.

One reason why conventional SDRAMs 40 cannot operate at optimum speed is the relatively long time required to decode the commands. As shown in FIGS. 2–5, the control logic 48 must decode four command signals (i.e., CS*, RAS*, CAS*, and WE*) to determine the state of the SDRAM 40 and the nature of any column command (i.e., a READ or a WRITE command). The time required for conventional decoder circuits to decode command signals increases markedly with the number of signals that must be decoded. Since the control logic 48 must decode four command signals to determine whether an internal column address or an external column address should be used, decoding the command signals limits the operating speed of conventional SDRAMs. There is therefore a need to be able to increase the rate at which command signals can be decoded to select either an internal or external column address.

SUMMARY OF THE INVENTION

A method and apparatus for coupling either an external address terminal or an internal address terminal to a column address decoder in a synchronous memory device. The decoder decodes, only column command signals to determine whether the command signals corresponds to a column command or a bust command. If the column command signals correspond to a column command, the external address terminal is coupled to the address decoder. If the column command signals do not correspond to a column command, the internal address terminal is coupled to the address decoder. The column command signals are preferably decoded prior to a transition of a clock signal that initiates a memory access. Decoding the column command signals is preferably enabled only if the memory device is in a column command state after a row of the memory device has been activated. If a row has not been activated, the external address terminal is coupled to the row address decoder without the need to check other command signals. The column address decoder is coupled to either the external address terminal or the internal address terminal by a multiplexer responsive to a multiplexer control signal. The multiplexer control signal is generated by a column command signal decoder that decodes only the column command signals, preferably prior to the transition of the clock signal that initiates a memory access.

DETAILED DESCRIPTION OF THE INVENTION

Figure 7:
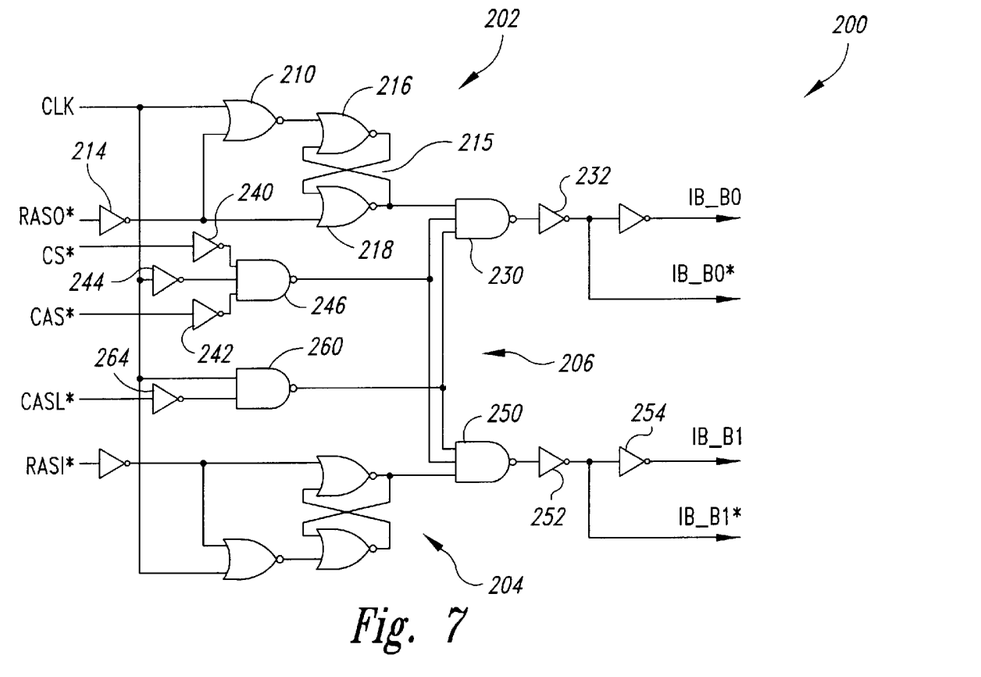
FIG. 7 is a logic diagram of one embodiment of a column address selection circuit in accordance with the present invention.

An address selection circuit 200 in accordance with one embodiment of the invention is illustrated in FIG. 7. The operation of the address selection circuit 200 will be explained with reference to the timing diagram of FIG. 8.

The address selection circuit 200 may be part of the control logic 48 (FIG. 1), and it generates an address selection signal IB_BO and its complement IB_BO* to control the coupling of an internal column address or an external column address to the I/O interface 54 for Bank0. (In the SDRAM of FIG. 1, the column decoder 512 includes multiplexers that couple the output of the column decoder 84 to either the I/O interface 54 for Bank0 or the I/O interface 54 for Bank1). Similarly, the address selection circuit 200 generates an address selection signal IB_B1 and its complement IB_B1* to control the coupling of an internal column address or an external column address to the I/O interface 54 for Bank1. When the IB_B0 signal is high (and its complement IB_BO* is, of course, low), an external column address from the address latch or buffer 62 is coupled from the column decoder 84 to the I/O interface 54 for Bank0. When the IB_B0 signal is low, an internal column address from the column address counter/latch 78 is coupled from the column decoder 84 to the I/O interface 54 for Bank0. Similarly, when the IB_B1 signal is high, an external column address from the address latch or buffer 62 is coupled to the I/O interface 54 for Bank1, and when the IB_B1 signal is low, an internal column address from the column address counter/latch 78 is coupled to the I/O interface 54 for Bank1. Thus, a high IB signal selects an external column address and a low IB signal selects and internal column address.

Figure 8:
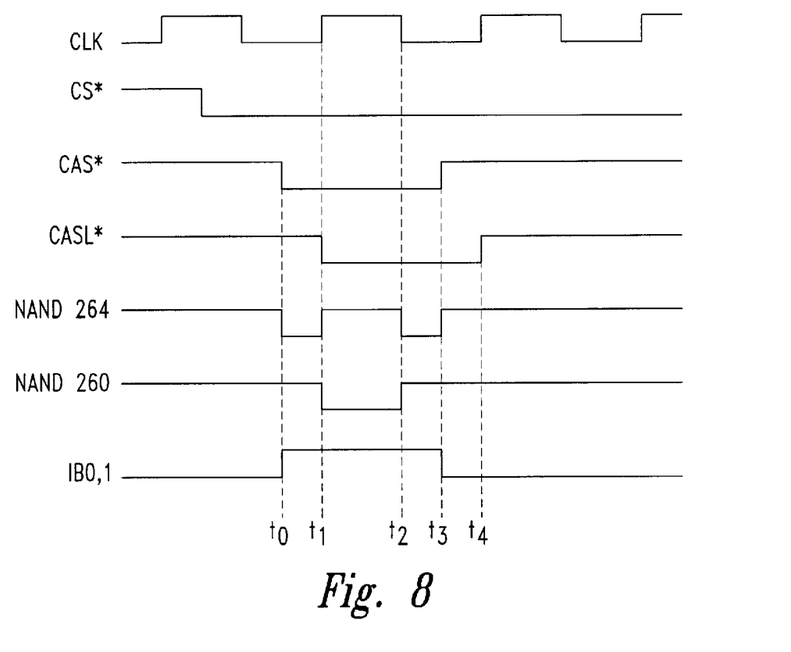
FIG. 8 is a timing diagram showing various signals present in the column address selection circuit of FIG. 7.

The address selection circuit 200 receives a latched row address strobe signal RAS0*, RAS1* for each memory bank 42 as well as a chip select signal CS*, and a column address strobe signal CAS*. As is a well known in the art, other circuitry in the control logic 48 generates the latched RAS0* and RAS1* signals as well as a latched column address strobe signal CASL*. The RAS0* and RAS1* signals are generated by conventional circuitry (not shown) that latches the RAS* signal applied to the SDRAM 40 on the rising edge of the CLK signal. The output of the latch then sets an S-R flip-flop that then outputs active low RAS0* and RAS1* signals, depending on the bank selected by the bank address. The S-R flip-flop is reset at the start of the row active state by conventional means. Thus, once RAS0* and RAS1* transition low, they remain low for the entire period of the column command state. The latched column address strobe signal CASL* is also generated by conventional circuitry (not shown) elsewhere in the SDRAM 40. Basically, CASL* is generated by setting a latch when CAS* and CS* are both active low. The clock signal CLK, chip select signal CS*, column address strobe signal CAS*, and latched column address strobe signal CASL* are shown in FIG. 8.

The address selection circuit 200 contains basically three sections. A first section 202 controls the address selection signals IB_B0 and IB_B0* for the first memory bank based on the state of the first row address strobe signal RAS0*, a third section 204 similarly controls the address selection signals IB_B1 and IB_B1* for the second memory bank based on the state of the second row address strobe signal RAS1*. A second section 206 controls the address selection signals for both memory banks 42 based on the state of the column commands, i.e. the chip select signal CS* and the column address strobe-signal CAS*.

The first section 202 includes a NOR gate 210 that receives the CLK signal and the first row address strobe signal RAS0* through an inverter 214. The output of the NOR gate 210 is applied to a flip-flop 215 formed by a pair of NOR gates 216, 218. The NOR gate 218 also receives the complement of RAS0* from the output of the inverter 214. As mentioned above, if RAS0* is low, the SDRAM 40 is in the row activate state in which the multiplexer 79 will never use and internal address. Therefore, when RAS0* is a low, the high at the output of the inverter 214 sets the flip-flop 215, thereby causing the NOR gate 218 to output a low. The low at the output of the NOR gate 218 is applied to a NAND gate 230 which then outputs a high. The high at the output of the NAND gate 230 is coupled through a pair of inverters 232, 234 to generate a high IB_B0 signal and a low IB_B0* signal that, as explained above, selects an external address.

If the row address strobe signal RAS0* is inactive high, the SDRAM 40 may respond to a column address, which may be either an internal column address or an external column address. If RAS0* is high, the inverter 214 outputs a low that causes the NOR gate 210 to output a high on the subsequent leading edge of the CLK signal. The NOR gate 210 then reset the flip-flop 215 to cause the NOR gate 218 to output a high that enables the NAND gate 230. The output of the NAND gate 230 is then controlled according to the nature of the column command signals to select either an internal column address or an external column address.

The third section 204 operates in the same manner as the first section 202 to provide address selection signals IB_B1 and IB_B1* for the Bank1 42 of the SDRAM 40 based on the state of the second row address strobe signal RAS1*. An explanation of the structure and operation of the third section 204 will thus be omitted in the interest of brevity.

With further reference to FIG. 7, the active low chip select signal CS* and the active low column address strobe signal CAS*, and the clock signal CLK are applied through respective inverters 240, 242, 244 to a NAND gate 246. Referring to FIG. 8, when the SDRAM 40 is being accessed, the chip select signal CS* will be active low. Thus, when the column address strobe signal CAS* goes low at $t_0$, the output of the NAND gate 246 will go low since the clock signal CLK is low at time $t_0$. As explained above, a low column address strobe signal CAS* is indicative of a column command such, as a READ command or a WRITE command. As further explained above, the multiplexer must couple an external address to the pre-decoder 102 in the event of a column command. Thus, when a column command is decoded by the NAND gate 246, the output of the NAND gate 246 will go low. The low at the output of the NAND gate 246 forces the output of the NAND gate 230 high, thereby making the address selection signals IB_B0 high and IB_B0* low to couple an external address to the pre-decoder 102. Thus, as shown in FIG. 8, the address selection signal IB_B0,1 goes high at $t_0$.

The output of the NAND gate 246 is also applied to a NAND gate 250. The output of the NAND gate 250 is coupled through a pair of inverters 252, 254 to generate address selection signals IB_B1 and IB_B1* for the memory Bank1. The signals are generated in the same manner as the address selection signals for Bank0, as explained above.

When the clock signal CLK goes high at $t_1$, the low at the output of the inverter 2244 causes the output of the NAND gate 246 to go high. As a result, the address selection signals IB_B0,1 would go low if it were controlled entirely by the output of the NAND gate 246. However, the address selection signals IB_B0,1 are also controlled by the output of a NAND gate 260. The NAND gate 260 receives the CLK signal as well as the complement of the active low latched column address strobe signal CASL* through an inverter 264. As shown in FIG. 8, CASL* goes low and CLK goes high at time $t_1$. As a result, the output of the NAND gate 260 goes low at time $t_1$. The low at the output of the NAND gate 260 maintains the respective outputs of the NAND gates 230, 250 high, thus maintaining the address selection signals IB_B0,1 high.

When the CLK signal goes low at time t2, the output of the NAND gate 260 goes high, but the output of the NAND gate 246 goes low to maintain the address selection signals IB_B0,1 high. Thus, the multiplexer continues to select an external column address. However, a conventional SDRAM like the SDRAM 40 shown in FIG. 1 only responds to column commands when CLK is high. Therefore, the state of IB_B0,1 when CLK is low is not significant since the column address is not used at that time.

With further reference to FIG. 8, at time $t_3$, CAS* goes high to change the column command from a READ command to a NOP command. As explained above with reference to FIG. 6, a NOP command causes a burst memory access to occur on each rising edge of the CLK signal. During a burst memory access, the multiplexer must select an internal column address generated by the column address counter/latch 78 (FIG. 1). When CAS* goes high at $t_3$, the output of the NAND gate 246 goes high since CLK is low at time $t_3$. Since the output of the NAND gate 260 is also high at that time because the CLK signal is low, the respective outputs of the NAND gates 230, 250 go low, thereby making the address selection signals IB_B0,1 low. As a result, the internal column address from the column address counter/latch 78 is selected. At time $t_4$, the high CAS* signal is latched on the leading edge of the CLK signal to transition CASL* high. The high CASL* signal maintains the output of the NAND gate 260 high after $t_4$ when the CLK signal goes high. As a result, the internal column address continues to be selected by the multiplexer as a burst READ occurs on each leading edge of the CLK signal.

The primary advantage of the preferred embodiment of the address selection circuit shown in FIG. 7 is the earlier time at which the address selection signals IB_B0,1 are generated as compared to prior art techniques. As explained above, using prior art circuitry, the address selection signals are not generated until command signals are latched into the control logic 48 on each rising edge of the CLK signal. Thus, using the prior art approach, the low CAS* signal after time to would not be latched into the control logic 48 until time $t_1$. Decoding of the command signals would thereafter occur and the address selection signals IB_B0,1 would therefore not be generated until sometime after time $t_1$. In contrast, the address selection circuit 200 illustrated FIG. 7 is able to generate the address selection signals IB_B0,1 at a somewhat earlier time at $t_0$ because it decodes the command signals CS* and CAS* prior to the rising age of the CLK signal. The output of the NAND gate 246 thus sets up the address selection signals IB_B0,1, and the NAND gate 260 thereafter maintains the address selection signals in that condition.

In a similar manner, prior art circuitry would not decode the NOP command generated at time $t_3$ until the subsequent rising edge of the CLK signal at time $t_4$. As a result, the prior art circuitry could not generate address selection signals IB_B0,1 to select an internal column address until sometime after time $t_4$. However, by decoding the NOP command starting at time $t_3$, the address selection circuit 200 is able to generate the address selection signals IB_B0,1 at a somewhat earlier time. Consequently, when a memory access is initiated on the rising edge of the CLK signal, the pre-decoder 102 (FIG. 1) is already connected to the proper source of the column address. The SDRAM 40 using the address selection circuit 200 may thus be able to operate at a higher clock frequency, thus allowing the SDRAM 40 to read and write data at a faster rate.

The address selection circuit shown in FIG. 7 also has the advantage of being able to generate the address selection signals IB_B0,1 at an earlier time because it requires that only two command signals be decoded. More specifically, the address selection signals IB_B0,1 are generated responsive to decoding only CAS* and CS*. As explained above, the conventional approach to generating the address selection signals IB_B0,1 requires that four command signals be decoded. As further explained above, decoding four command signals requires significantly more time than is required to decode only two command signals. Thus, the address selection circuit of FIG. 7 is able to provide the address selection signals IB_B0,1 at an earlier time than is possible with the conventional approach for two reasons. First, by decoding command signals prior to the rising edge of the clock signal CLK that is used to initiate a memory access. Second, by decoding only two command signals to generate the address selection signals IB_B0,1.

Figure 9:
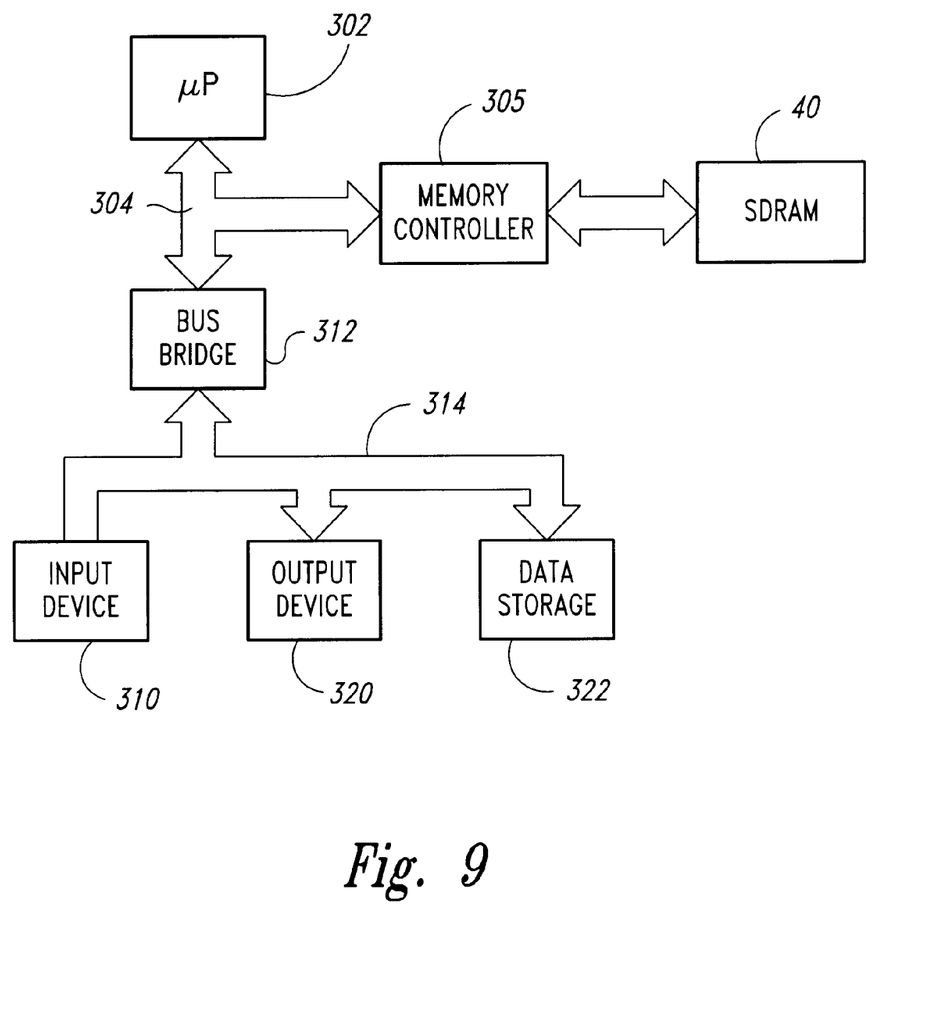
FIG. 9 is a block diagram of a computer system using the SDRAM of FIG. 1 containing the column address selection circuit of FIG. 7.

The SDRAM 40 can be used in a computer system, as shown in FIG. 9. With reference to FIG. 9, the computer system 300 includes a processor 302 having a processor bus 304 coupled through a memory controller 305 to the SDRAM 40. The computer system 300 also includes one or more input devices 310, such as a keypad or a mouse, coupled to the processor 302 through a bus bridge 312 and an expansion bus 314, such as an Industry Standard Architecture ("ISA") bus or a Peripheral Component Interconnect ("PCI") bus. The input devices 310 allow an operator or an electronic device to input data to the computer system 300. One or more output devices 320 are coupled to the processor 302 to display or otherwise output data generated by the processor 302. The output devices 320 are coupled to the processor 302 through the expansion bus 314, bus bridge 312 and processor bus 304. Examples of output devices 320 include printers and video display units. One or more data storage devices 322 are coupled to the processor 302 through the processor bus 304, bus bridge 312, and expansion bus 314 to store data in or retrieve data from storage media (not shown). Examples of storage devices 322 and storage media include fixed disk drives floppy disk drives, tape cassettes and compact-disk read-only memory drives. The computer system 300 also includes a number of other components and signal lines that have been omitted from FIG. 9 in the interests of brevity.

In operation, the processor 302 communicates with the SDRAM 40 via the memory controller 305. The memory controller 305 sends the SDRAM 40 control and address signals. Data is coupled between the processor 302 and the SDRAM 40 through the memory controller 305, although the data may be coupled directly to the data bus portion of the processor bus 304. The memory controller 305 applies write data from the processor 302 to the SDRAM 40, and it applies read data from the SDRAM 40 to the processor 302.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. In a synchronous memory device, a method of operating the memory device response to a clock signal and a plurality of externally applied memory commands, the method comprising:

receiving at least one memory command corresponding to a plurality of control signals;

asynchronously decoding some but less than all of the plurality of control signals that correspond to the at least one memory command prior to the first transition of the clock signal;

initiating a first memory operation in response to the decoding of some but less than all of the plurality of control signals that correspond to the at least one memory command;

synchronously decoding a remainder of the plurality of control signals that correspond to the at least one memory command responsive to the first transition of the clock signal; and initiating a second memory operation in response to the synchronous decoding of the remainder of the plurality of control signals that correspond to the at least one memory command, the second memory operation being related to the performance of the first of memory operation.

2. The method of claim 1 wherein the first memory operation comprises coupling an address to an address decoder, and the second memory operation comprises accessing a memory array in the memory device at a location corresponding to the address coupled to the address decoder.

3. The method of claim 1 wherein the second memory operation comprises decoding all of the control signals that correspond to the at least one memory command and initiating the memory operation in response thereto.

4. The method of claim 3 wherein the memory operation initiated in response the memory command decoded as part of the second memory operation comprises a read memory access.

5. The method of claim 3 wherein the memory operation initiated in response the memory command decoded as part of the second memory operation comprises a write memory access.

6. The method of claim 1 wherein the first memory operation comprises coupling an external address to an address decoder in response to the decoding of some but less than all of the plurality of control signals that correspond to the at least one memory command.

7. The method of claim 1 further comprising enabling the first memory operation to be initiated only if the clock signal has a predetermined logic level.

8. A method of operating a synchronous memory device responsive to a clock signal and a plurality of externally applied memory commands, the method comprising:

receiving a first memory command;

asynchronously decoding the first memory command and initiating a first memory operation in response to the decoded first memory command prior to a first transition of the clock signal but after an immediately preceding transition of the clock signal;

receiving a second memory command; and synchronously decoding the second memory command responsive to the first transition of the clock signal and initiating a second memory operation in response to the decoded second memory command, the second memory operation being related to the performance of the first memory operation.

9. The method of claim 8 wherein the first memory operation comprises coupling an address to an address decoder, and the second memory operation comprises accessing a memory array in the memory device at a location corresponding to the address coupled to the address decoder.

10. The method of claim 9 wherein the second memory operation comprises a read memory access.

11. The method of claim 9 wherein the second memory operation comprises a write memory access.

12. The method of claim 9 wherein the first memory operation comprises coupling an external address to an address decoder.

13. The method of claim 9 wherein the first memory operation comprises coupling an internally generated address to the address decoder.

14. The method of claim 8 further comprising enabling the first memory operation to be initiated only if the clock signal has a predetermined logic level.

15. A method of operating a synchronous memory device responsive to a clock signal and a memory command corresponding to a plurality of control signals, the method comprising:

some but less than all of the plurality of control signals that correspond to the at least one memory command prior to the first transition of the clock signal;

asynchronously decoding some but less than all of the plurality of control signals that correspond to the memory command to initiate a first memory operation without regard to the timing of the clock signal, the asynchronously decoding being inititated prior to a first transition of the clock signal but after an immediately preceding transition of the clock signal; and synchronously decoding remaining control signals in the plurality of control signals that correspond to the memory command to initiate a second memory operation in response to the first transition of the clock signal, the second memory operation being related to the performance of the first memory operation.

16. The method of claim 15 wherein the first memory operation comprises coupling an address to an address decoder, and the second memory operation comprises accessing a memory array in the memory device at a location corresponding to the address coupled to the address decoder.

17. The method of claim 15 wherein the second memory operation comprises decoding at least one memory command and initiating a memory operation in response thereto.

18. The method of claim 15 wherein the first memory operation comprises coupling an external address to an address decoder in response to a first asynchronously decoded memory command, and coupling an internally generated address to the address decoder in response to a first asynchronously decoded memory command.

* * * * *